(12) United States Patent
Mack et al.

(10) Patent No.: US 10,361,787 B2
(45) Date of Patent: Jul. 23, 2019

(54) METHOD AND SYSTEM FOR OPTICAL ALIGNMENT TO A SILICON PHOTONICALLY-ENABLED INTEGRATED CIRCUIT

(71) Applicant: Luxtera, Inc., Carlsbad, CA (US)

(72) Inventors: Michael Mack, San Diego, CA (US); Anders Dahl, Carlsbad, CA (US); Subal Sahni, La Jolla, CA (US); Steffen Gloeckner, San Diego, CA (US)

(73) Assignee: Luxtera, Inc., Carlsbad, CA (US)

( * ) Notice: Subject to any disclaimer, the term of this patent is extended or adjusted under 35 U.S.C. 154(b) by 70 days.

(21) Appl. No.: 15/694,130

(22) Filed: Sep. 1, 2017

(65) Prior Publication Data
US 2018/0062748 A1 Mar. 1, 2018

Related U.S. Application Data

(60) Provisional application No. 62/382,602, filed on Sep. 1, 2016.

(51) Int. Cl.
*H04B 10/00* (2013.01)
*H04B 10/40* (2013.01)
(Continued)

(52) U.S. Cl.
CPC .......... *H04B 10/40* (2013.01); *G02B 6/0288* (2013.01); *G02B 6/124* (2013.01); *G02B 6/422* (2013.01);
(Continued)

(58) Field of Classification Search
USPC ................................................ 398/156, 141
See application file for complete search history.

(56) References Cited

U.S. PATENT DOCUMENTS 6,853,770 B2 * 2/2005 Zhu ................ G02B 6/2931
385/127
6,967,347 B2 * 11/2005 Estes ................ B82Y 10/00
257/25
(Continued)

OTHER PUBLICATIONS

International Search Report and Written Opinion of the International Searching Authority, Application No. PCT/US2017/049887 dated Nov. 28, 2017.
(Continued)

*Primary Examiner* — Agustin Bello
(74) *Attorney, Agent, or Firm* — McAndrews, Held & Malloy

(57) ABSTRACT

Methods and systems for optical alignment to a silicon photonically-enabled integrated circuit may include aligning an optical assembly to a photonics die comprising a transceiver by, at least, communicating optical signals from the optical assembly into a plurality of grating couplers in the photonics die, communicating the one or more optical signals from the plurality of grating couplers to optical taps, with each tap having a first output coupled to the transceiver and a second output coupled to a corresponding output grating coupler, and monitoring an output optical signal communicated out of said photonic chip via said output grating couplers. The monitored output optical signal may be maximized by adjusting a position of the optical assembly. The optical assembly may include an optical source assembly comprising one or more lasers or the optical assembly may comprise a fiber array. Such a fiber array may include single mode optical fibers.

19 Claims, 8 Drawing Sheets

(51) Int. Cl.
*G02B 6/028* (2006.01)
*G02B 6/42* (2006.01)
*H04B 10/2581* (2013.01)
*G02B 6/124* (2006.01)
*H01L 21/68* (2006.01)
*H05K 13/04* (2006.01)
*G02B 6/12* (2006.01)

(52) U.S. Cl.
CPC ........... *G02B 6/426* (2013.01); *G02B 6/4213* (2013.01); *G02B 6/4214* (2013.01); *G02B 6/4246* (2013.01); *G02B 6/4295* (2013.01); *H01L 21/681* (2013.01); *H04B 10/2581* (2013.01); *H05K 13/0404* (2013.01); *G02B 2006/12147* (2013.01)

(56) References Cited

U.S. PATENT DOCUMENTS

| | | | | |
|---|---|---|---|---|
| 7,183,759 B1* | 2/2007 | Malendevich | ..... | G02B 6/12007 324/750.22 |
| 7,224,174 B1* | 5/2007 | Malendevich | ..... | G02B 6/12007 324/750.23 |
| 7,378,861 B1* | 5/2008 | Malendevich | ......... | G02B 6/124 324/750.23 |
| 9,235,014 B2* | 1/2016 | Wang | ................... | G02B 6/4214 |
| 9,453,723 B1* | 9/2016 | LeMaitre | ......... | G01R 31/31728 |
| 9,494,748 B2* | 11/2016 | Chen | ........................ | G02B 6/30 |
| 9,766,417 B2* | 9/2017 | Lemaitre | .............. | G02B 6/4227 |
| 9,829,659 B2* | 11/2017 | Chen | ........................ | G02B 6/30 |
| 10,041,875 B2* | 8/2018 | De Boer | ............... | G02B 6/4225 |
| 10,162,120 B2* | 12/2018 | Zine-El-Abidine | ...... | G02B 6/30 |
| 2004/0033026 A1* | 2/2004 | Zhu | ...................... | G02B 6/2931 385/52 |
| 2006/0008207 A1* | 1/2006 | Gunn, III | ............. | G02B 6/1228 385/37 |
| 2014/0203830 A1* | 7/2014 | Shin | ................... | G01R 31/2601 324/750.23 |
| 2016/0202432 A1* | 7/2016 | Chen | ........................ | G02B 6/30 385/14 |
| 2018/0062748 A1* | 3/2018 | Mack | ................... | G02B 6/0288 |

OTHER PUBLICATIONS

International Preliminary Report on Patentability (Chapter 1 of the Patent Cooperatioin Treaty) International Application No. PCT/US2017/049887; International Filing Date Sep. 1, 2017; dated Mar. 14, 2019.

* cited by examiner

METHOD AND SYSTEM FOR OPTICAL ALIGNMENT TO A SILICON PHOTONICALLY-ENABLED INTEGRATED CIRCUIT

CROSS-REFERENCE TO RELATED APPLICATIONS/INCORPORATION BY REFERENCE

This application claims priority to and the benefit of U.S. Provisional Application 62/382,602 filed on Sep. 1, 2016, which is hereby incorporated herein by reference in its entirety.

FIELD

Aspects of the present disclosure relate to electronic components. More specifically, certain implementations of the present disclosure relate to methods and systems for optical alignment to a silicon photonically-enabled integrated circuit.

BACKGROUND

Conventional approaches for active optical alignment may be costly, cumbersome, and/or inefficient—e.g., they may be complex and/or time consuming, and/or may introduce asymmetry.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for optical alignment to a silicon photonically-enabled integrated circuit, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry or a device is "operable" to perform a function whenever the circuitry or device comprises the necessary hardware and code (if any is necessary) to perform the function, regardless of whether performance of the function is disabled or not enabled (e.g., by a user-configurable setting, factory trim, etc.).

Figure 1A:
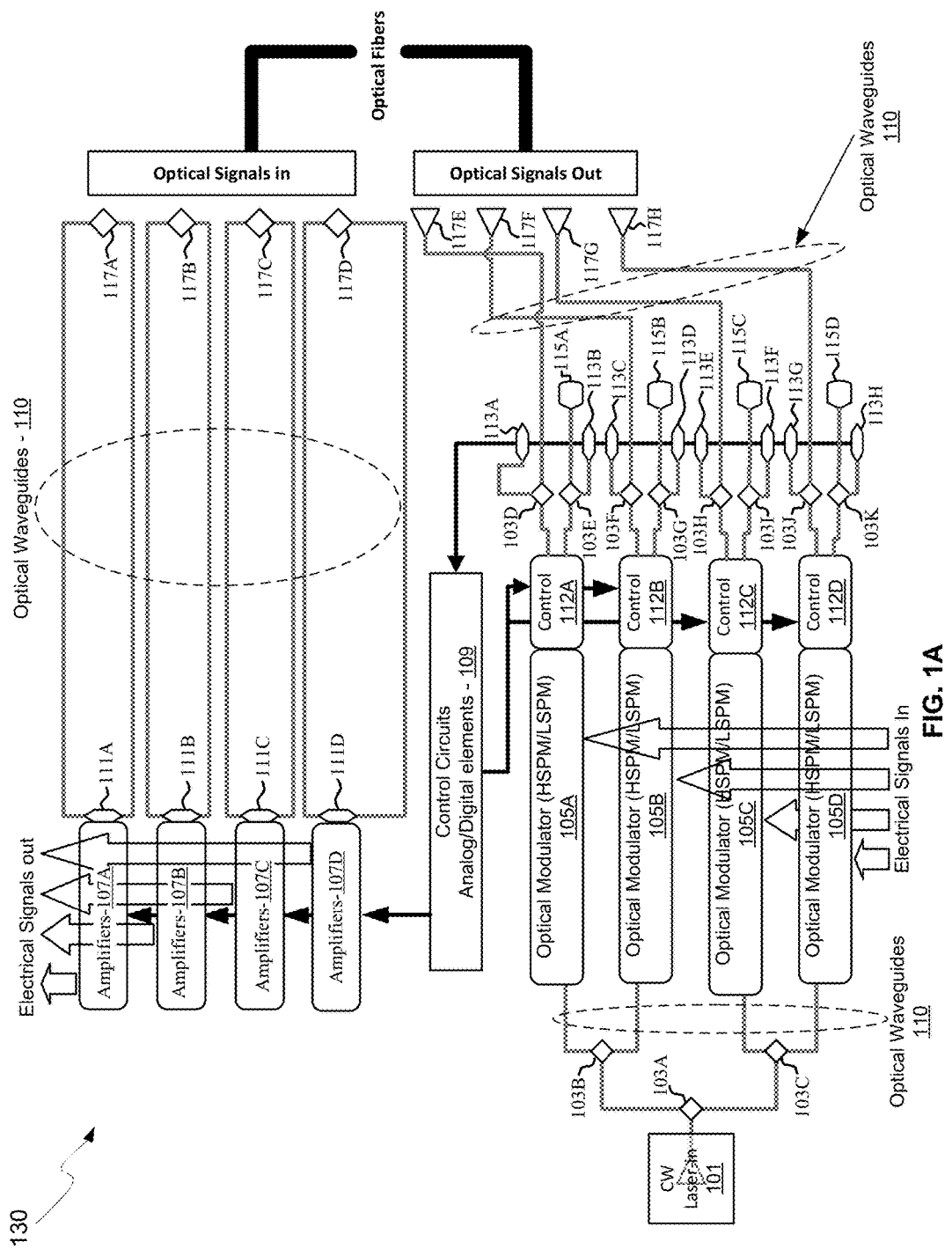
FIG. 1A is a block diagram of a photonically-enabled integrated circuit with built-in optical alignment, in accordance with an example embodiment of the disclosure.

FIG. 1A is a block diagram of a photonically-enabled integrated circuit with built-in optical alignment, in accordance with an example embodiment of the disclosure. Referring to FIG. 1A, there is shown optoelectronic devices on a photonically-enabled integrated circuit 130 comprising optical modulators 105A-105D, photodiodes 111A-111D, monitor photodiodes 113A-113H, and optical devices comprising couplers 103A-103K, optical terminations 115A-115D, and grating couplers 117A-117H. There are also shown electrical devices and circuits comprising amplifiers 107A-107D, analog and digital control circuits 109, and control sections 112A-112D. The amplifiers 107A-107D may comprise transimpedance and limiting amplifiers (TIA/LAs), for example.

In an example scenario, the photonically-enabled integrated circuit 130 comprises a CMOS photonics die with a laser assembly 101 coupled to the top surface of the IC 130. The laser assembly 101 may comprise one or more semiconductor lasers with isolators, lenses, and/or rotators for directing one or more CW optical signals to the coupler 103A. The photonically enabled integrated circuit 130 may comprise a single chip, or may be integrated on a plurality of die, such as one or more electronics die and one or more photonics die.

Optical signals are communicated between optical and optoelectronic devices via optical waveguides 110 fabricated in the photonically-enabled integrated circuit 130. Single-mode or multi-mode waveguides may be used in photonic integrated circuits. Single-mode operation enables direct connection to optical signal processing and networking elements. The term "single-mode" may be used for waveguides that support a single mode for each of the two polarizations, transverse-electric (TE) and transverse-magnetic (TM), or for waveguides that are truly single mode and only support one mode whose polarization is TE, which comprises an electric field parallel to the substrate supporting the waveguides. Two typical waveguide cross-sections that are utilized comprise strip waveguides and rib waveguides. Strip waveguides typically comprise a rectangular cross-section, whereas rib waveguides comprise a rib section on top of a waveguide slab. Of course, other waveguide cross section types are also contemplated and within the scope of the disclosure.

In an example scenario, the couplers 103A-103C may comprise low-loss Y-junction power splitters where coupler 103A receives an optical signal from the laser assembly 101 and splits the signal to two branches that direct the optical signals to the couplers 103B and 103C, which split the optical signal once more, resulting in four roughly equal power optical signals.

The optical power splitter may comprise at least one input waveguide and at least two output waveguides. The couplers 103A-103C shown in FIG. 1A illustrates 1-by-2 splitters, which divide the optical power in one waveguide into two other waveguides evenly. These Y-junction splitters may be used in multiple locations in an optoelectronic system, such as in a Mach-Zehnder interferometer (MZI) modulator, e.g., the optical modulators 105A-105D, where a splitter and a combiner are needed, since a power combiner can be a splitter used in reverse.

In another example scenario, the Y-junction may be utilized in a parallel multi-channel transmitter, where a cascade of 1-by-2 splitters can be employed to have a single light source feed multiple channels. Interleaver-based multiplexers and demultiplexers constitute a third example where 1-by-2 splitters are among the building blocks.

The optical modulators 105A-105D comprise Mach-Zehnder or ring modulators, for example, and enable the modulation of the continuous-wave (CW) laser input signal. The optical modulators 105A-105D may comprise high-speed and low-speed phase modulation sections and are controlled by the control sections 112A-112D. The high-speed phase modulation section of the optical modulators 105A-105D may modulate a CW light source signal with a data signal. The low-speed phase modulation section of the optical modulators 105A-105D may compensate for slowly varying phase factors such as those induced by mismatch between the waveguides, waveguide temperature, or waveguide stress and is referred to as the passive phase, or the passive biasing of the MZI.

In an example scenario, the high-speed optical phase modulators may operate based on the free carrier dispersion effect and may demonstrate a high overlap between the free carrier modulation region and the optical mode. High-speed phase modulation of an optical mode propagating in a waveguide is the building block of several types of signal encoding used for high data rate optical communications. Speed in the several Gb/s may be required to sustain the high data rates used in modern optical links and can be achieved in integrated Si photonics by modulating the depletion region of a PN junction placed across the waveguide carrying the optical beam. In order to increase the modulation efficiency and minimize the loss, the overlap between the optical mode and the depletion region of the PN junction is optimized.

The outputs of the optical modulators 105A-105D may be optically coupled via the waveguides 110 to the grating couplers 117E-117H. The couplers 103D-103K may comprise four-port optical couplers, for example, and may be utilized to sample or split the optical signals generated by the optical modulators 105A-105D, with the sampled signals being measured by the monitor photodiodes 113A-113H. The unused branches of the directional couplers 103D-103K may be terminated by optical terminations 115A-115D to avoid back reflections of unwanted signals.

The grating couplers 117A-117H comprise optical gratings that enable coupling of light into and out of the photonically-enabled integrated circuit 130. The grating couplers 117A-117D may be utilized to couple light received from optical fibers into the photonically-enabled integrated circuit 130, and the grating couplers 117E-117H may be utilized to couple light from the photonically-enabled integrated circuit 130 into optical fibers. The grating couplers 117A-117H may comprise single polarization grating couplers (SPGC) and/or polarization splitting grating couplers (PSGC). In instances where a PSGC is utilized, two input, or output, waveguides may be utilized.

The optical fibers may be affixed using epoxy, for example, to the CMOS chip, and may be aligned at an angle from normal to the surface of the photonically-enabled integrated circuit 130 to optimize coupling efficiency. In an example embodiment, the optical fibers may comprise single-mode fiber (SMF) and/or polarization-maintaining fiber (PMF).

The photodiodes 111A-111D may convert optical signals received from the grating couplers 117A-117D into electrical signals that are communicated to the amplifiers 107A-107D for processing. In another embodiment of the disclosure, the photodiodes 111A-111D may comprise high-speed heterojunction phototransistors, for example, and may comprise germanium (Ge) in the collector and base regions for absorption in the 1.3-1.6 μm optical wavelength range, and may be integrated on a CMOS silicon-on-insulator (SOI) wafer.

In the receiver subsystem implemented in a silicon chip, light is often coupled into a photodetector via a polarization-splitting grating coupler that supports coupling all polarization states of the fiber mode efficiently. The incoming signal is split by the PSGC into two separate waveguides in a polarization-diversity scheme, and therefore both inputs to the waveguide photodetectors are used. If two different PSGCs are required to couple into the same photodetector, then the PD has have four separate waveguide ports.

The analog and digital control circuits 109 may control gain levels or other parameters in the operation of the amplifiers 107A-107D, which may then communicate electrical signals off the photonically-enabled integrated circuit 130. The control sections 112A-112D comprise electronic circuitry that enable modulation of the CW laser signal received from the splitters 103A-103C. The optical modulators 105A-105D may require high-speed electrical signals to modulate the refractive index in respective branches of a Mach-Zehnder interferometer (MZI), for example.

In operation, the photonically-enabled integrated circuit 130 may be operable to transmit and/or receive and process optical signals. Optical signals may be received from optical fibers by the grating couplers 117A-117D and converted to electrical signals by the photodetectors 111A-111D. The electrical signals may be amplified by transimpedance amplifiers in the amplifiers 107A-107D, for example, and subsequently communicated to other electronic circuitry, not shown, in the photonically-enabled integrated circuit 130.

Integrated photonics platforms allow the full functionality of an optical transceiver to be integrated on a single chip. An optical transceiver chip contains optoelectronic circuits that create and process the optical/electrical signals on the transmitter (Tx) and the receiver (Rx) sides, as well as optical interfaces that couple the optical signals to and from a fiber. The signal processing functionality may include modulating the optical carrier, detecting the optical signal, splitting or combining data streams, and multiplexing or demultiplexing data on carriers with different wavelengths, and equalizing signals for reducing and/or eliminating inter-symbol interference (ISI), which may be a common impairment in optical communication systems.

In the field of fiber optic communications, the packaging of optical components has long been recognized as costly and problematic and often this limits the applications of photonic solutions. This problem is more difficult when the components to be aligned are being used to construct a single mode transmission system. In such single mode systems, the requirements for low loss coupling necessitate alignments to approximately 1 micron or less. Performing such alignment by purely passive means (i.e. using visual/mechanical alignment) is often not possible unless submicron mechanical alignment features can be incorporated into the parts being aligned.

In practice, it is difficult to incorporate mechanical alignment features and only a small number of problems can be solved with such an approach. More often, one must resort to so called "active alignment" processes where the components to be aligned must be activated (i.e. powered on) and are aligned with the aid of a feedback signal. Typically, these critical active alignments must be done at an advanced stage of the assembly process where the system or portions of the system can be made active to facilitate the generation of a suitable feedback signal for alignment. In this case, because the alignment process is using functional blocks specific to a particular product's function, the alignment process and tooling must be tailored specifically for that product. As such, each new product, even when the same underlying technology is used, often requires new tooling and processes requiring both the tool and the process to be tailored on a product-by-product basis.

In an example embodiment of the disclosure, passive optical taps with feedback loops to grating couplers for transmission back out of the chip may be utilized in the photonically-enabled integrated circuit 130 to enable active alignment to the photonically enabled integrated circuits. The disclosure allows the construction of a passive (i.e. not requiring power or control of silicon photonically-enabled integrated circuit), product-independent, and design-rule driven platform for scalable and cost effective active optical alignment to silicon photonically-enabled integrated circuits. The method and system can be used for both packaging and test of components constructed from silicon photonically enabled integrated circuits. In addition, accurate monitoring of the alignment stability of temperature sensitive light sources through the attach process using a normalization detector is disclosed.

Silicon photonically-enabled integrated circuit technology allows for the ubiquitous use of optical library components that can be integrated compactly, with essentially no additional cost, into large scale electro-optical circuits. The disclosure describes using passive optical sub-circuits connected to the photonic input/output nodes of a silicon photonic die, combined together with optically enabled tooling, to create optical feedback signal for active optical alignment of input/output components. The disclosed system and method do not rely on the inward or outward coupling path for any particular product, but rather follows product-independent design rules, which allows a more general solution to the technological problem of active optical alignment that is made practical by the ability to freely add passive optical components such as splitters and surface grating couplers to photonic integrated circuits.

Figure 1B:
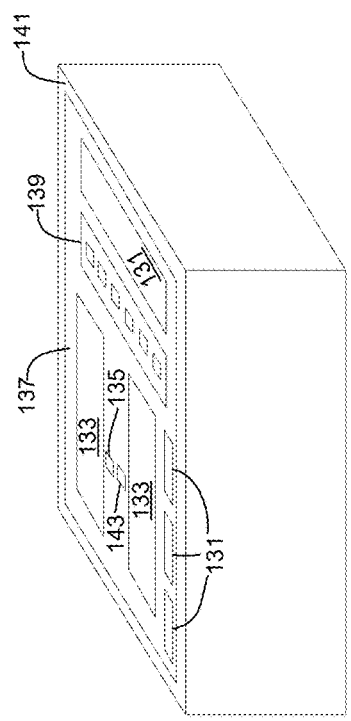
FIG. 1B is a diagram illustrating an exemplary photonically-enabled integrated circuit, in accordance with an example embodiment of the disclosure.

FIG. 1B is a diagram illustrating an exemplary photonically-enabled integrated circuit, in accordance with an example embodiment of the disclosure. Referring to FIG. 1B, there is shown the photonically-enabled integrated circuit 130 comprising electronic devices/circuits 131, optical and optoelectronic devices 133, a light source interface 135, a chip front surface 137, an optical fiber interface 139, CMOS guard ring 141, and a surface-illuminated monitor photodiode 143.

The light source interface 135 and the optical fiber interface 139 comprise grating couplers, for example, that enable coupling of light signals via the CMOS chip surface 137, as opposed to the edges of the chip as with conventional edge-emitting/receiving devices. Coupling light signals via the chip surface 137 enables the use of the CMOS guard ring 141 which protects the chip mechanically and prevents the entry of contaminants via the chip edge.

The electronic devices/circuits 131 comprise circuitry such as the amplifiers 107A-107D and the analog and digital control circuits 109 described with respect to FIG. 1A, for example. The optical and optoelectronic devices 133 comprise devices such as the couplers 103A-103K, optical terminations 115A-115D, grating couplers 117A-117H, optical modulators 105A-105D, high-speed heterojunction photodiodes 111A-111D, and monitor photodiodes 113A-113H.

Figure 1C:
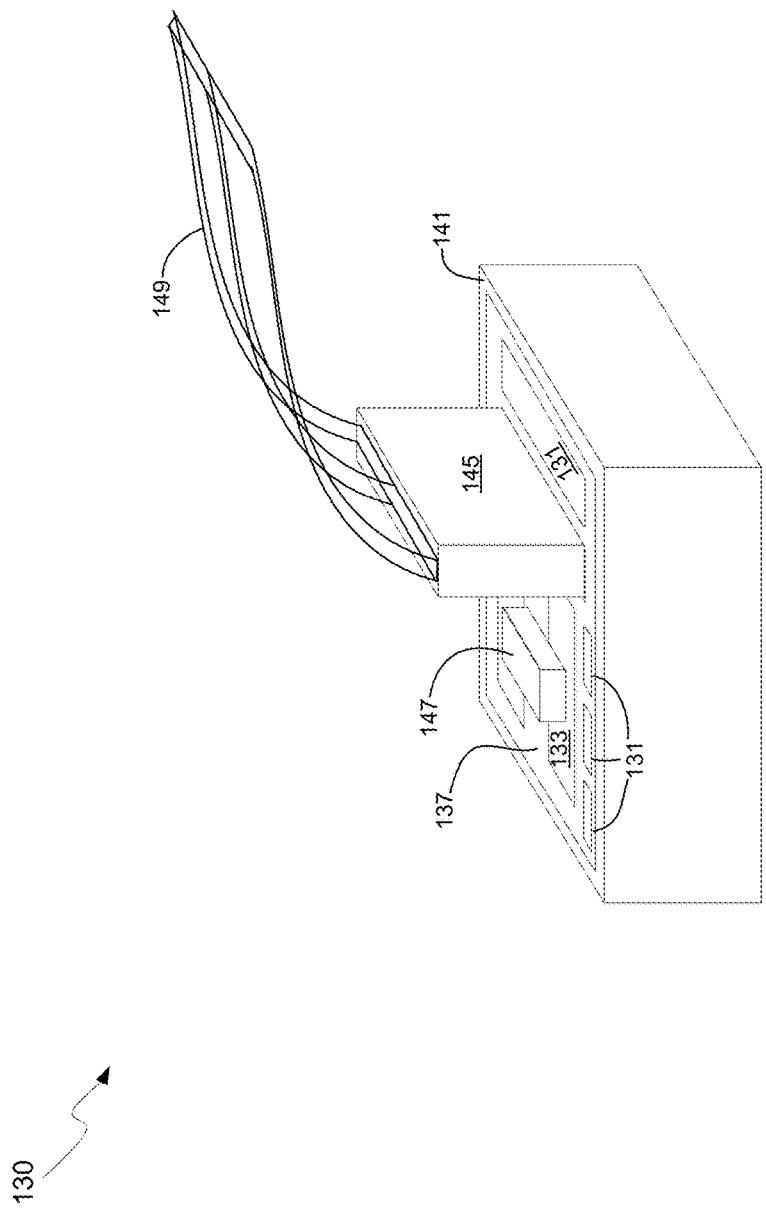
FIG. 1C is a diagram illustrating a photonically-enabled integrated circuit coupled to an optical fiber cable, in accordance with an example embodiment of the disclosure.

FIG. 1C is a diagram illustrating a photonically-enabled integrated circuit coupled to an optical fiber cable, in accordance with an example embodiment of the disclosure. Referring to FIG. 1C, there is shown the photonically-enabled integrated circuit 130 comprising the chip surface 137 and the CMOS guard ring 141. There are also shown a fiber-to-chip coupler 145, an optical fiber cable 149, and an optical source assembly 147.

The photonically-enabled integrated circuit 130 comprises the electronic devices/circuits 131, the optical and optoelectronic devices 133, the light source interface 135, the chip surface 137, and the CMOS guard ring 141 may be as described with respect to FIG. 1B for example.

In an example embodiment, the optical fiber cable may be affixed, via epoxy for example, to the CMOS chip surface 137. The fiber chip coupler 145 enables the physical coupling of the optical fiber cable 149 to the photonically-enabled integrated circuit 130. In another example scenario, the IC 130 may comprise photonic devices on one die, such as a photonics interposer, and electrical devices on an electronics die, both of which may comprise CMOS die.

The coupling of the fiber-to-chip coupler 145 and the optical source assembly 147 may be enabled with a gripper in a pick-and-place tool that comprises one or more optical fibers coupled to couplers in the optical chip 135 such that the optical circuitry and/or the optical sources may be tested in an active alignment procedure, while not requiring the powering up of the chip 135. This "pseudo-active" alignment follows product-independent design rules, which allows a more general solution to the technological problem of active optical alignment that is made practical by the ability to freely add passive optical components such as splitters and surface grating couplers to photonic integrated circuits.

While a single die is shown in FIGS. 1A-1C, the chip 135 may instead comprise a plurality of die. In an example scenario, one or more electronic die may be coupled to a photonics die, i.e., a photonic interposer, comprising optical and optoelectronic devices for communicating optical signals between electronics die, for example.

Figure 2:
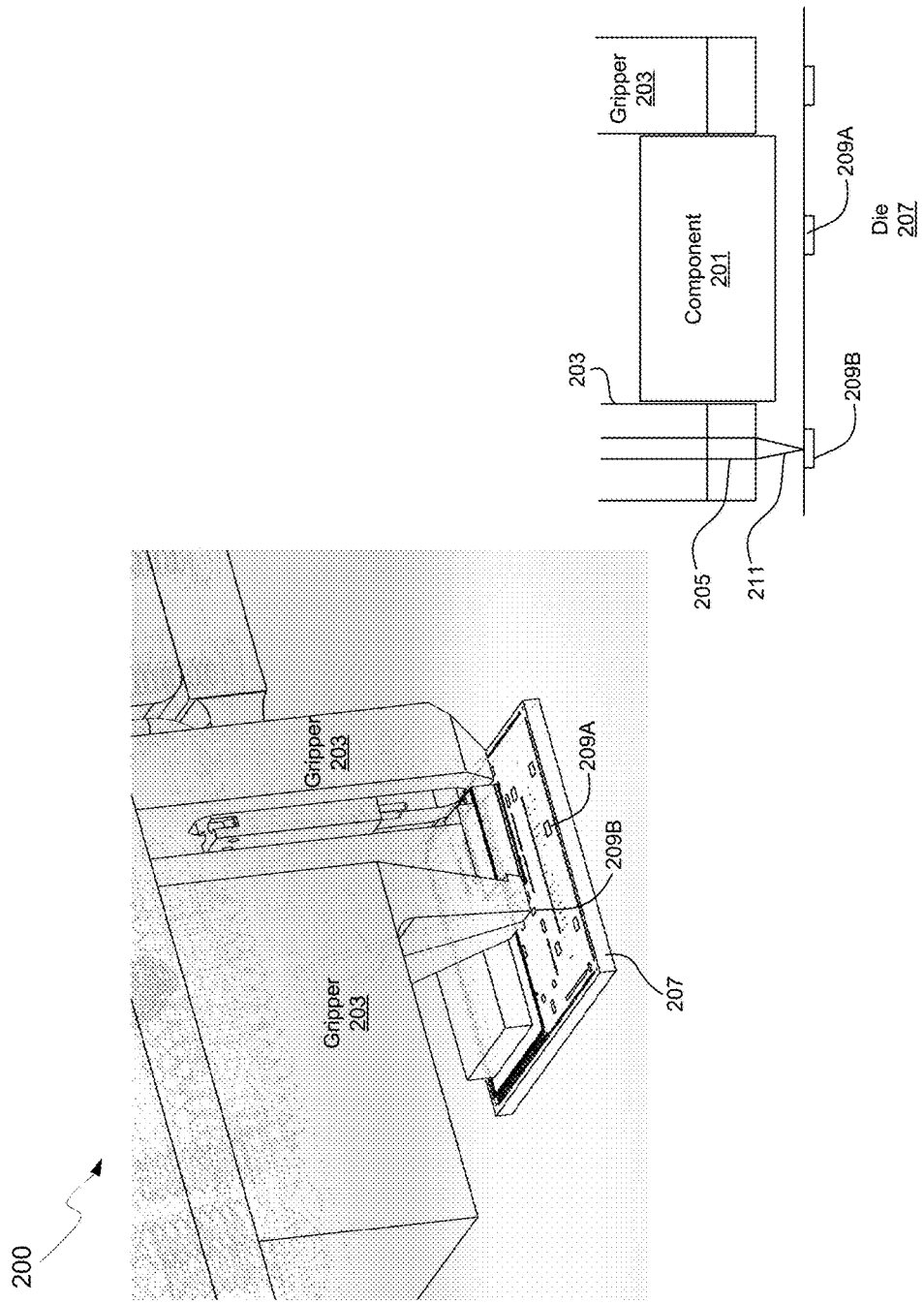
FIG. 2 illustrates a micro-packaged laser light source to be aligned to an photonic integrated circuit, in accordance with an example embodiment of the disclosure.

FIG. 2 illustrates a micro-packaged laser light source to be aligned to an photonic integrated circuit, in accordance with an example embodiment of the disclosure. Referring to FIG. 2, there are shown a component 201, a gripper 203, an optical fiber 205, and a photonic integrated circuit 207 with grating coupler 209A and 209B. The component 201 may comprise a micro-packaged light source that may be configured to direct an output beam through the bottom of the package at an angle that is designed to couple into the grating coupler 209A on the surface of the photonic integrated circuit 207. The optical fiber 205 may comprise a multi-mode fiber for receiving optical signals from the photonic IC 207 even in instances when not perfectly aligned with output grating couplers.

The gripper 203 comprises an automated pick and place tool, for example, that may place components on integrated circuits. The gripper may use mechanical and/or vacuum techniques to hold packages for placement. The gripper 203 may comprise one or more optical fibers, such as optical fiber 205, for receiving optical signals from the die 207, enabling the active alignment of devices without powering up full functionality of the die 207. The gripper 203 may be moved in multiple directions to maximize the optical signals, thereby aligning the component 201 to the die 207.

Passive taps may be incorporated into the photonic integrated circuit 207 to direct a small portion of the coupled light to an output grating coupler 209B that is positioned according to a fixed design rule, which is based on the component and tooling, to couple that small portion of light into a large diameter multi-mode fiber 205 that has been incorporated into the gripper 203 that holds the micro-packaged light source. The inclusion of the feedback collection element, the multi-mode fiber in this example, into the gripper further makes this technique agnostic to the actual product design or form-factor that the light source is being attached to. As an example of the utility of this approach, the same tooling and integrated circuit design may be used to align micro-packaged light sources of different size/output-power.

Figure 3:
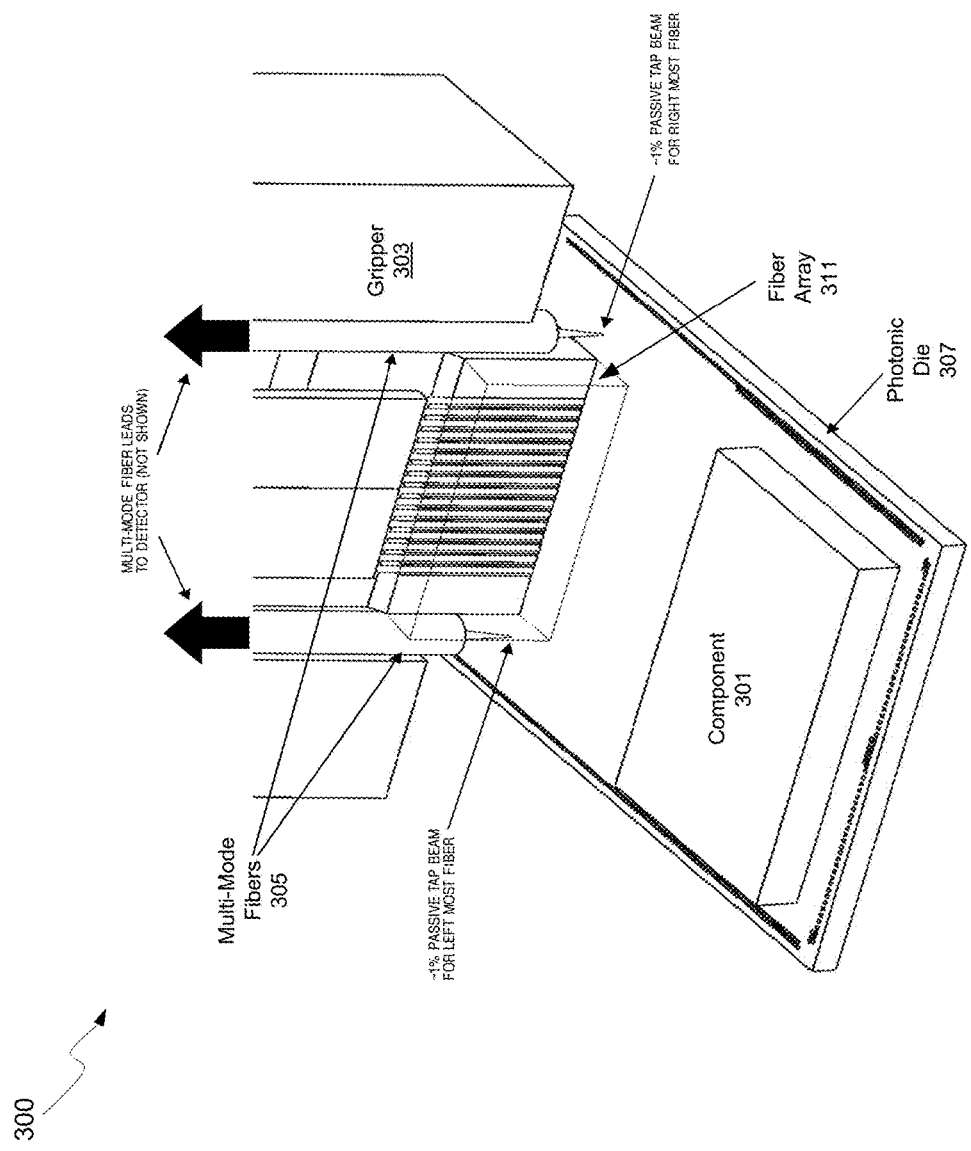
FIG. 3 illustrates the alignment of a fiber array to a photonic integrated circuit with multiple feedback paths to enable simultaneous alignment of multiple fibers and grating input/output couplers, in accordance with an example embodiment of the disclosure.

FIG. 3 illustrates the alignment of a fiber array to a photonic integrated circuit with multiple feedback paths to enable simultaneous alignment of multiple fibers and grating input/output couplers, in accordance with an example embodiment of the disclosure. Referring to FIG. 3, there are shown a component 301, a gripper 303, multi-mode fibers 305, a photonic die 307, and a fiber array 311. The gripper 303 comprises an automated pick and place tool, for example, that may place components on integrated circuits. The gripper 303 may use mechanical and/or vacuum techniques to hold packages for placement. The gripper 303 may comprise one or more optical fibers, such as optical fibers 305, for coupling optical signals into and receiving optical signals from the die 307, enabling the active alignment of devices without powering up full functionality of the die 307. The component 301 may comprise an integrated circuit die or an optical source assembly coupled to the photonic die 307, where as an optical source assembly, the component 301 is operable to provide optical source signals for the photonic die 307.

The photonic die 307 may comprise optical, optoelectronic, and electronic devices, such as those described with respect to FIG. 1A for example. The fiber array 311 may comprise an array of single-mode fibers, for example, for coupling optical signals into and out of the photonic die 307. In an example embodiment, the fiber array 311 comprises 8 or 16 fibers that communicate optical signals to and from grating couplers in the photonic die 307.

In this example, the fiber gripper 303 incorporates two multi-mode fibers that lead to two separate detectors. The optical fibers 305 may comprise multi-mode fibers that are large enough in diameter to collect optical signals when not exactly aligned with an output grating coupler in the photonic die 307, enabling proper alignment by maximizing the received optical signal. The gripper 303 may be moved in multiple directions to maximize the optical signals, thereby aligning the fiber array 311 to the photonic die 307.

This coupling of optical signals into the multi-mode fibers 305 allows the yaw and position of the fiber array to be configured for optimum coupling and ensures the correct alignment of the fiber array 311 to the die 307. This structure also allows the same tooling to be used on arrays of different size and fiber count provided the distance from the gripped edge of the array to the outermost fiber is kept as a design constant. This approach enables the same tooling to be used to grip and align both 8 fiber channel arrays and 16 fiber channel arrays, for example.

Figure 4:
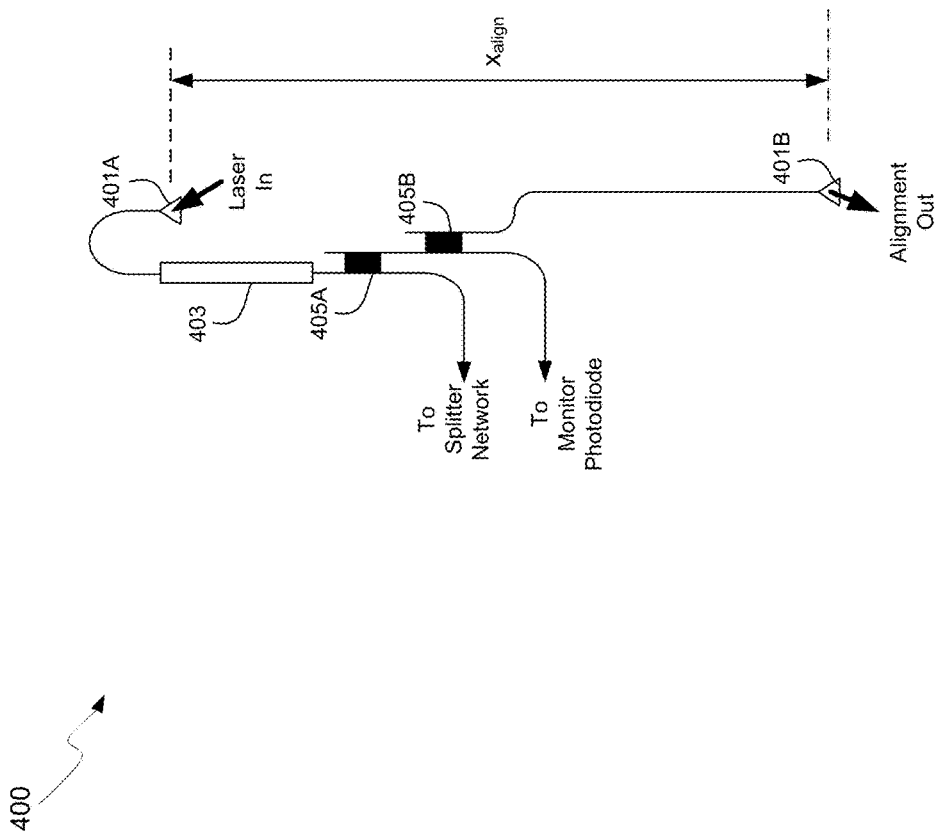
FIG. 4 illustrates a partial photonic routing schematic for a passive tap circuit that enables alignment of a micro-packaged light source without enabling/powering the photonic integrated circuit, in accordance with an example embodiment of the disclosure.

FIG. 4 illustrates a partial photonic routing schematic for a passive tap circuit that enables alignment of a micro-packaged light source without enabling/powering the photonic integrated circuit, in accordance with an example embodiment of the disclosure. Referring to FIG. 4, there are shown grating couplers 401A and 401B, a mode filter 403, and taps 405A and 405B. The mode filter 403 comprises an optical filter for filtering out any extraneous modes, such as cladding modes for example, that are coupled into the grating coupler 401A.

The grating couplers 401A and 401B may comprise single polarization grating couplers, for example, for coupling optical signals into and/or out of the photonic circuit 400. The distance between the grating couplers 401A and 401B may be a product-independent distance, $x_{align}$ for example, that may be used for the grippers or other similar tooling that place devices, which can then be used for any photonics die.

The taps 405A and 405B may comprise stabilized directional couplers for splitting a portion of a received optical signal into first and second output paths. The amount coupled to each output may be configured by the thickness of and spacing between waveguides in the couplers. Accordingly, a small portion may be split into the alignment photonic circuitry with the majority of the signal being coupled to the main transceiver circuitry, as described with respect to FIG. 1A for example.

The photonic circuit 400 is an example of the photonic schematic used to implement a passive alignment tap as shown in FIG. 2. As described, larger diameter multi-mode fibers may be utilized to guide the alignment light to a detector used to generate the feedback signal. In principle, it is also possible to directly illuminate a large (>>10 micron) detector via grating couplers in the die. In this example, the use of large diameter multi-mode fiber allows greater latitude in the design of the gripper tooling. In an example scenario, the feedback detector has a receiving aperture that is large when compared to the spatial overlap of the component/grating coupler to be aligned.

In operation, when an optical source is being coupled to the die, it may be placed over the grating coupler 401A, such that an optical signal is coupled into the photonic circuit 400 and to the filter 403, which filters out optical signals other than the desired mode, which is then coupled to the tap 405A. One output of the tap 405A is the input signal to a splitter network, such as the couplers 103A-103C described with respect to FIG. 1A, for example, while the other output is coupled to the second tap 405B. A first output of the tap 405B is coupled to a monitor photodiode that is used to monitor the laser source during normal operation while a second output of the tap 405B is coupled to the grating coupler 401B, which couples the signal vertically out of the die where it may be captured by a multi-mode fiber, such as the fiber 205, described with respect to FIG. 2 for example. This optical signal may be coupled to a detector, as described with to respect to FIG. 6 for example, for monitoring the alignment process. Maximizing the optical signal received at the photodetector indicates an optimum optical alignment of the laser input signal.

Figure 5:
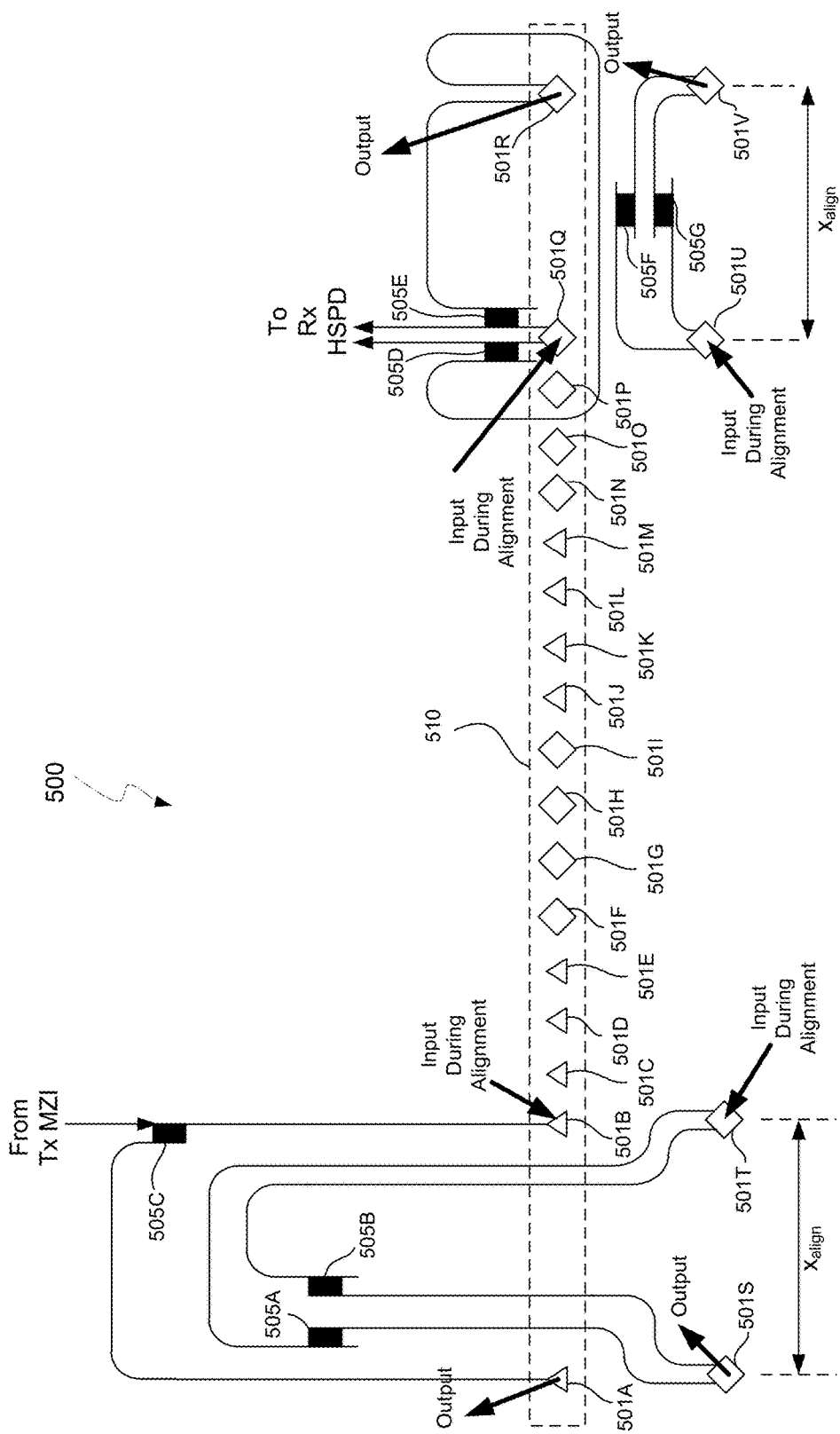
FIG. 5 shows an example of a partial photonic routing schematic for a passive tap circuit designed to enable alignment of a fiber array without enabling/powering the photonic integrated circuit, in accordance with an example embodiment of the disclosure.

FIG. 5 shows an example of a partial photonic routing schematic for a passive tap circuit designed to enable alignment of a fiber array without enabling/powering the photonic integrated circuit, in accordance with an example embodiment of the disclosure. The photonic circuit 500 comprises arrays of grating couplers 501A-501V for the fiber array to be coupled to the photonic circuit 500 as well as for the alignment fibers. There is also shown an optical assembly 510 and taps 505A-505G. In an example embodiment, the grating couplers 501A-501E and 501J-501M comprise single polarization grating couplers while grating couplers 501F-501I and 501N-501V comprise polarization splitting grating couplers.

The optical assembly 510, as indicated by the dashed line, may comprise an array of optical fibers, for example, similar to the fiber-to-chip coupler 145 with fibers 149 or fiber array 311 described above. As shown in FIG. 5, optical signals may be coupled from the optical assembly 510 into grating couplers 510B-501Q on the photonic chip, routed via optical waveguides on the photonic chip to a tap, such as the taps 505A-505E, where a portion of the signal may be fed back to the alignment structure via another large diameter fiber. The remaining signal may be coupled into Rx and/or Tx optical circuitry for testing. The distance between the grating couplers, $X_{align}$, for the large diameter fibers may be dictated by the design of the gripper that places the optical assembly.

The grating couplers 501S-501V may comprise optional extra alignment couplers, where these PSGCs are offset from the main axis of the optical assembly 510 for further alignment capability. In addition, polarization alignment capability is thereby provided in instances when the input signal polarization is not aligned properly when the input signal is coupled to the single polarization grating coupler 501B, as the grating coupler 501S will couple different polarizations.

Figure 6:
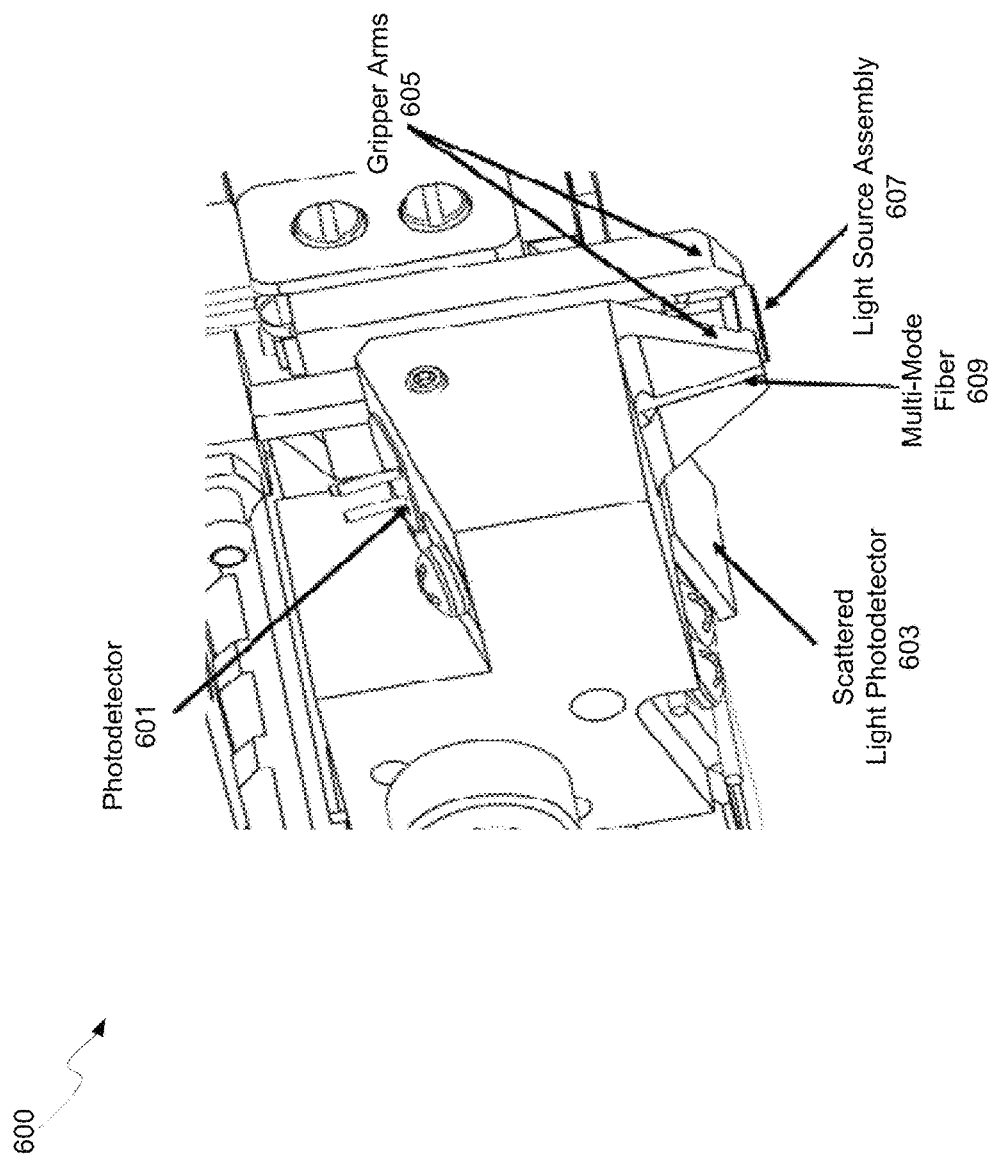
FIG. 6 shows a variation of an optically-enabled gripper with photodetectors, in accordance with an example embodiment of the disclosure.

FIG. 6 shows a variation of an optically-enabled gripper with photodetectors, in accordance with an example embodiment of the disclosure. The gripper assembly 600 comprises a photodetector 601, a large area detector 603, gripper arms 605, a light source assembly 607 for mounting to a die, and a fiber 609. The photodetector 601 may comprise a TO-can type detector mounted in the gripper assembly 600 for sensing optical signals from fiber 609. The light source assembly may comprise one or more lasers for providing optical signals to a die to which it is affixed, and may be similar to the optical source assembly 147 described above for example.

The large area detector 603 may be operable to collect scattered light from the alignment environment that can be used to normalize the coupled light signal. The signal on the large area normalization detector 603 may be proportional to the lasing power and can be used to normalize the coupled power signal even though the temperature may fluctuate during the process. This monitoring of scattered light using the large area detector 603 is a particularly useful tool to help accurately monitor the coupling efficiency of a temperature sensitive light source (i.e. where output power fluctuates with temperature), because the fixing process with heat or ultraviolet light heats the light source assembly and decreases its emission power such that it would be impractical in a production process to wait for the whole assembly to cool to the pre-cure temperature to make an accurate measurement of the pre-to-post cure coupling change. With the aid of the normalization large area detector 603, the change in the coupling efficiency can be assessed accurately without waiting for the light source temperature to stabilize.

The output of the photodetector 601 may be utilized to perform the active alignment to grating couplers in the photonic die, such as the grating couplers 209B, 401B, 501A, 510R 501S, and 501V described previously. The gripper arms may be utilized to pick and place the light source assembly 607 to a photonics die.

In an example embodiment of the disclosure, a method and system is described for aligning an optical assembly to a photonic die and comprises aligning an optical assembly to a photonics die comprising a transceiver. Such aligning may be achieved by communicating one or more optical signals from the optical assembly into a plurality of grating couplers in the photonics die, communicating the one or more optical signals from the plurality of grating couplers to optical taps, with each tap having a first output coupled to said transceiver and a second output coupled to a corresponding output grating coupler, and monitoring an output optical signal communicated out of said photonic chip via said output grating couplers.

The monitored output optical signal may be maximized by adjusting a position of the optical assembly. The optical assembly may comprise an optical source assembly comprising one or more lasers or the optical assembly may comprise a fiber array. Such a fiber array may comprise single mode optical fibers, for example. The optical assembly may be aligned to the photonics die using a gripper with a multimode fiber for receiving the output optical signal. The output optical signal may be monitored using a photodetector in the gripper, with the photodetector coupled to the multimode fiber, or directly illuminated from the chip. A first subset of the plurality of grating couplers may comprise single polarization grating couplers and a second subset of the plurality of grating couplers comprise polarization splitting grating couplers. The photonics die may comprise a complementary metal oxide semiconductor (CMOS) die.

While the present disclosure has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system for communication, the system comprising:
an optical transceiver in a photonics die with photonics circuitry for aligning an optical assembly to the photonics die, the system being operable to:
receive the optical assembly on the photonics die via a gripper;
communicate one or more optical signals from said optical assembly into a plurality of grating couplers in said photonics die;
communicate said one or more optical signals from said plurality of grating couplers to optical taps, each tap having a first output coupled to said transceiver and a second output coupled to a corresponding output grating coupler; and
monitor, using a photodetector in the gripper, an output optical signal communicated, via said output grating couplers, out of said photonics die.

2. The system according to claim 1, wherein the system is operable to maximize the monitored output optical signal by adjusting a position of the optical assembly.

3. The system according to claim 1, wherein the optical assembly comprises an optical source assembly comprising one or more lasers.

4. The system according to claim 1, wherein the optical assembly comprises a fiber array.

5. The system according to claim 4, wherein the fiber array comprises single mode optical fibers.

6. The system according to claim 1, wherein the gripper comprises a multimode fiber for receiving the output optical signal.

7. The system according to claim 6, wherein the photodetector in the gripper is coupled to the multimode fiber.

8. The system according to claim 1, wherein the system is operable to monitor the output optical signal using direct illumination of the photodetector in the gripper.

9. The system according to claim 1, wherein a first subset of the plurality of grating couplers comprises single polarization grating couplers and a second subset of the plurality of grating couplers comprises polarization splitting grating couplers.

10. A method for communication, the method comprising:
aligning an optical assembly to a photonics die comprising a transceiver by, at least:
receiving the optical assembly on the photonics die via a gripper;
communicating one or more optical signals from said optical assembly into a plurality of grating couplers in said photonics die;
communicating said one or more optical signals from said plurality of grating couplers to optical taps, each tap having a first output coupled to said transceiver and a second output coupled to a corresponding output grating coupler; and
monitoring, using a photodetector in the gripper, an output optical signal communicated, via said output grating couplers, out of said photonics die.

11. The method according to claim 10, comprising maximizing the monitored output optical signal by adjusting a position of the optical assembly.

12. The method according to claim 10, wherein the optical assembly comprises an optical source assembly comprising one or more lasers.

13. The method according to claim 12, wherein the optical assembly comprises a fiber array.

14. The method according to claim 10, wherein the fiber array comprises single mode optical fibers.

15. The method according to claim 10, wherein the gripper comprises a multimode fiber for receiving the output optical signal.

16. The method according to claim 15, wherein the photodetector is coupled to the multimode fiber.

17. The method according to claim 10, comprising monitoring the output optical signal using direct illumination of the photodetector in the gripper.

18. The method according to claim 10, wherein a first subset of the plurality of grating couplers comprises single polarization grating couplers.

19. The method according to claim 18, wherein a second subset of the plurality of grating couplers comprises polarization splitting grating couplers.

* * * * *